United States Patent [19]
Kido et al.

[11] Patent Number: 6,013,384
[45] Date of Patent: Jan. 11, 2000

[54] ORGANIC ELECTROLUMINESCENT DEVICES

[75] Inventors: Junji Kido, 9-4-3, Umamikita Kouryou-cho, Kitakatsuragi-gun, Nara-ken; Tokio Mizukami, Kanagawa-ken, both of Japan

[73] Assignees: Junji Kido, Nara-ken; International Manufacturing and Engineering Services Co., Ltd., Kanagawa-ken, both of Japan

[21] Appl. No.: 09/012,048

[22] Filed: Jan. 22, 1998

[30] Foreign Application Priority Data

Jan. 27, 1997 [JP] Japan .................................. 9-012815
Mar. 27, 1997 [JP] Japan .................................. 9-075833

[51] Int. Cl.$^7$ ............................................ H05B 33/00
[52] U.S. Cl. .......................... 428/690; 428/917; 313/504; 345/36; 345/45; 345/76
[58] Field of Search .................................. 428/690, 917; 313/504; 345/36, 45, 76

[56] References Cited

FOREIGN PATENT DOCUMENTS

| | | | |
|---|---|---|---|
| 373582 | 3/1995 | European Pat. Off. ........ | H05B 33/14 |
| 388768 | 8/1995 | European Pat. Off. ........ | H05B 33/14 |
| 59-194393 | 11/1984 | Japan ............................ | H05B 33/14 |
| 63-295695 | 12/1988 | Japan ............................ | C09K 11/06 |
| 2-88689 | 3/1990 | Japan ............................ | C09K 11/06 |
| 2-191694 | 7/1990 | Japan ............................ | C09K 11/00 |
| 2-196885 | 8/1990 | Japan ............................ | C09K 11/06 |
| 2-250292 | 10/1990 | Japan ............................ | H05B 33/14 |
| 2-252793 | 10/1990 | Japan ............................ | C09K 11/06 |
| 2-255789 | 10/1990 | Japan ............................ | C09K 11/06 |
| 2-289676 | 11/1990 | Japan ............................ | C09K 11/06 |
| 3-231970 | 10/1991 | Japan ............................ | C09B 23/00 |
| 3-296595 | 12/1991 | Japan ............................ | C09K 11/06 |
| 4-96990 | 3/1992 | Japan ............................ | C09K 11/06 |
| 5-9470 | 1/1993 | Japan ............................ | C09K 11/06 |
| 517764 | 1/1993 | Japan ............................ | C09K 11/06 |
| 5202011 | 8/1993 | Japan ............................ | C07D 271/10 |
| 6-25659 | 2/1994 | Japan ............................ | C09K 11/06 |
| 6-49079 | 2/1994 | Japan ............................ | C07F 7/10 |

(List continued on next page.)

OTHER PUBLICATIONS

Database WPI, Section Ch, Week 9339, Derwent Publications Ltd., London, GB; Class E13, AN 93–309361; XP002087791 and JP 05 222361 A (Mitsubishi Kasei Corp) Aug. 31, 1993—abstract.
Database WPI, Section Ch, Week 9250, Derwent Publications Ltd., London, GB; Class E13, AN 92–411660: XP002087792 and JP 04 308689 A (Mitsubishi Kasei Corp) Oct. 30, 1992—abstract.
Organic EL Devices Doped With a Quinacridone Derivative Showing Higher Brightness and Luminescent Efficiency.
High Bright Organic Thin Film EL Devices Using a Li Ally Cathode.
A Calcium Oxide Can Be Reduced by Aluminum.
Metal Handbook p. 88—Minimumtranlation.
Metal Handbood p. 87—3 Sentanietranslation.
Polymer Light–Emitting Electrochemical Cells.
Physical Review Letters (vol. 14, No. 7) pp. 228–231 only.
IEEE Transactions on Electron Diodes (vol. 40, No. 7).
Organic Electroluminescent Diodes.
Society for Information Display International Symposium Digest of Technical Papers (vol. XXVIII).
Organic EL Cells Using Alkaline Metal Compounds as Electron Injection Materials Electroluminescence from Polyvinylcarbazole.

*Primary Examiner*—Charles Nold
*Attorney, Agent, or Firm*—McCormick, Paulding & Huber LLP

[57] ABSTRACT

An organic electroluminescent (EL) device includes at least one luminescent layer having an organic compound doped with a metal capable of acting as a donor dopant, in adjacent to a cathode electrode. The EL device ensures a diminished energy barrier in an electron injection from the cathode electrode into the luminescent layer, i.e., metal-doped organic compound layer, and thus a lowered driving voltage. The lowered driving voltage can be obtained regardless of the work function of the cathode material.

6 Claims, 3 Drawing Sheets

U.S. PATENT DOCUMENTS

| | | | | |
|---|---|---|---|---|
| 6-88072 | 3/1994 | Japan | ............................ | C09K 11/06 |
| 6-100857 | 4/1994 | Japan | ............................ | C09K 11/06 |
| 6-92947 | 4/1994 | Japan | ........................... | C07D 271/10 |
| 6-107648 | 5/1994 | Japan | ........................... | C07D 271/10 |
| 6-132080 | 5/1994 | Japan | ............................ | H05B 33/14 |
| 6-145146 | 5/1994 | Japan | ........................... | C07D 215/30 |
| 6-203963 | 7/1994 | Japan | ........................... | D05B 33/22 |
| 6-206865 | 7/1994 | Japan | ........................... | C07D 209/86 |
| 6-207170 | 7/1994 | Japan | ............................ | C09K 11/06 |
| 6-215874 | 8/1994 | Japan | ........................... | H05B 33/22 |
| 6-279322 | 10/1994 | Japan | ........................... | C07C 13/547 |
| 6-279323 | 10/1994 | Japan | ........................... | C07C 13/567 |
| 6-293778 | 10/1994 | Japan | ............................. | C07F 7/10 |
| 7-101911 | 4/1995 | Japan | ........................... | C07C 211/61 |
| 7-97355 | 4/1995 | Japan | ........................... | C07C 211/54 |
| 7-126225 | 5/1995 | Japan | ............................ | C07C 211/54 |
| 7-126226 | 5/1995 | Japan | ............................ | C07C 211/54 |
| 7-145116 | 6/1995 | Japan | ............................ | C07C 211/54 |
| 7-157473 | 6/1995 | Japan | ........................... | C07D 251/24 |
| 7-179394 | 7/1995 | Japan | ............................. | C07C 63/72 |
| 7-188130 | 7/1995 | Japan | ............................ | C07C 211/54 |
| 7-224012 | 8/1995 | Japan | ............................ | C07C 211/61 |
| 7-228579 | 8/1995 | Japan | ........................... | C07D 271/10 |
| 7-278124 | 10/1995 | Japan | ........................... | C07D 271/10 |
| 8-22557 | 1/1996 | Japan | ............................ | G06T 15/00 |
| 8-40995 | 2/1996 | Japan | ........................... | C07C 211/54 |
| 8-40996 | 2/1996 | Japan | ........................... | C07C 211/54 |
| 8-40997 | 2/1996 | Japan | ........................... | C07C 211/54 |
| 8-48656 | 2/1996 | Japan | ........................... | C07C 211/54 |
| 8-81472 | 3/1996 | Japan | ............................. | C07F 3/00 |

ORGANIC ELECTROLUMINESCENT DEVICES

BACKGROUND OF THE INVENTION

1. Field of the Invention

The present invention relates to an organic electroluminescent device or element (hereinafter, also referred to as an "organic EL device") which can be advantageously, for example, utilized as a planar light source or in display devices.

2. Description of the Related Art

Attention has been made to an organic electroluminescent device having a luminescent layer, i.e., light-emitting layer, formed from the specific organic compound, because it ensures a large area display device with low-voltage driving. To obtain an EL device with a high efficiency, Tang et al., as is reported in Appl. Phys. Lett., 51, 913 (1987), have succeeded in providing an EL device having a structure in which organic compound layers having different carrier transporting properties are laminated to thereby introduce holes and electrons with a good balance from an anode and a cathode, respectively. In addition, since the thickness of the organic compound layers is less than or equal to 2,000 Å, the EL device can exhibit a high luminance and efficiency sufficient in practical use, that is, a luminance of about 1,000 cd/m$^2$ and an external quantum efficiency of about 1% at an applied voltage of not more than about 10 volts.

In the above-described high efficiency EL device, Tang et al. used a magnesium (Mg) having a low work function in combination with the organic compound which is basically considered to be an electrically insulating material, in order to reduce an energy barrier which can cause a problem during injection of electrons from a metal-made electrode. However, since the magnesium is liable to be oxidized and is instable, and also exhibits only a poor adhesion to a surface of the organic layers, magnesium was used after alloying, i.e., by the co-deposition of the same with silver (Ag) which is relatively stable and exhibits good adhesion to a surface of the organic layers.

On the other hand, the researchers of Toppan Printing Co. (cf, 51st periodical meeting, Society of Applied Physics, Preprint 28a-PB-4, p.1040) and those of Pioneer Co. (cf, 54th periodical meeting, Society of Applied Physics, Preprint 29p-ZC-15, p.1127) have had developments in the usage of lithium (Li), which has an even lower work function than that of Mg, and alloying the same with an aluminum (Al) to obtain a stabilized cathode, thereby embodying a lower driving voltage and a higher emitting luminance in comparison with those of the EL device using the Mg alloy. In addition, as is reported in IEEE Trans. Electron Devices., 40, 1342 (1993), the inventors of the present application have found that a two-layered cathode produced by depositing lithium (Li) alone with a very small thickness of about 10 Å on an organic compound layer, followed by laminating a silver (Ag) to the thus deposited Li layer is effective to attain a low driving voltage in the EL devices.

Further, recently, Pei et al. of Uniax Co. have proceeded to reduce a driving voltage of the EL device by doping a polymeric luminescent layer with a Li salt (cf. Science, 269, 1086 (1995)). This doping method is intended to dissociate the Li salt dispersed in the polymeric luminescent layer to distribute Li ions and counter ions near the cathode and near the anode, respectively, thus ensuring an in-situ doping of the polymer molecules positioned near the electrodes. According to this method, since the polymers near the cathode are reduced with Li as a donor dopant, i.e., electron-donating dopant, and thus the reduced polymers are contained in the state of radical anions, a barrier of the electron injection from the cathode can be remarkably reduced, contrary to the similar method including no Li doping.

However, due to oxidation of the electrodes and other reasons, deterioration of the device can be resulted in the above-described EL devices using an alloy of Mg or Li as the electrode material. In addition, use of the alloy-made electrodes results in limitation in the selection of suitable material for the electrodes, because the electrode material to be used has to simultaneously satisfy the requirement for the function as a wiring material. Further, the two-layered cathode developed by the inventors (described above) is unable to act as a cathode when a thickness of the Li layer is above about 20 Å (cf. IEEE Trans. Electron Devices., 40, 1342 (1993). Furthermore, in the in-situ doping method developed by Pei et al. in which the Li salt is added to the luminescent layer to cause their dissociation in the electric field, there is a problem with the transfer time of the dissociated ions to the close vicinity of the electrodes having a controlled velocity, thereby causing a remarkable retardation of the response speed of the devices.

SUMMARY OF THE INVENTION

The present invention has been provided in view of the above-described circumstances of the prior art, and accordingly one object of the present invention is to reduce an energy barrier in the electron injection of from a cathode electrode to an organic compound layer, thereby ensuring a low-voltage driving regardless of the work function of the cathode material.

Another object of the present invention is to provide a device (organic electroluminescent device) capable of indicating satisfactory characteristics which are similar to or higher than those obtained using the above-described alloy as the electrode material, when aluminum or other low-cost and stable metals which are conventionally used as the wiring material in the prior art are used alone as the cathode material.

The inventors have now found that if an organic compound layer positioned adjacent to the cathode is doped with a metal which can act as a donor dopant, i.e., electron-donating dopant, a barrier in the electron injection from the cathode to the organic compound layer can be diminished, thereby lowering a driving voltage of the device.

That is, the present invention concerns an organic electroluminescent (EL) device comprising at least one luminescent layer constituted from an organic compound, positioned between an anode electrode and a cathode electrode opposed to each other, and is characterized by a layer of an organic compound doped with a metal capable of acting as a donor dopant being contained in an interfacial surface with the cathode electrode.

More particularly, the donor dopant used herein can be constituted from at least one metal selected from alkali metals, alkali earth metals and transition metals including rare earth metals, such metals having a work function of at less than or equal to 4.2 eV. Further, it is preferred that a concentration of the donor dopant in the metal-doped organic compound layer is in the range of about 0.1 to 99% by weight, and a thickness of the metal-doped organic compound layer is in the range of about 10 to 3,000 Å.

The present disclosure relates to subject matter contained in Japanese Patent Application Nos. 9-12815 (filed on Jan. 27, 1997) and 9-75833 (filed on Mar. 27, 1997) which are expressly incorporated herein by reference in their entireties.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

The present invention will be further described with reference to the preferred embodiments thereof.

Figure 1:
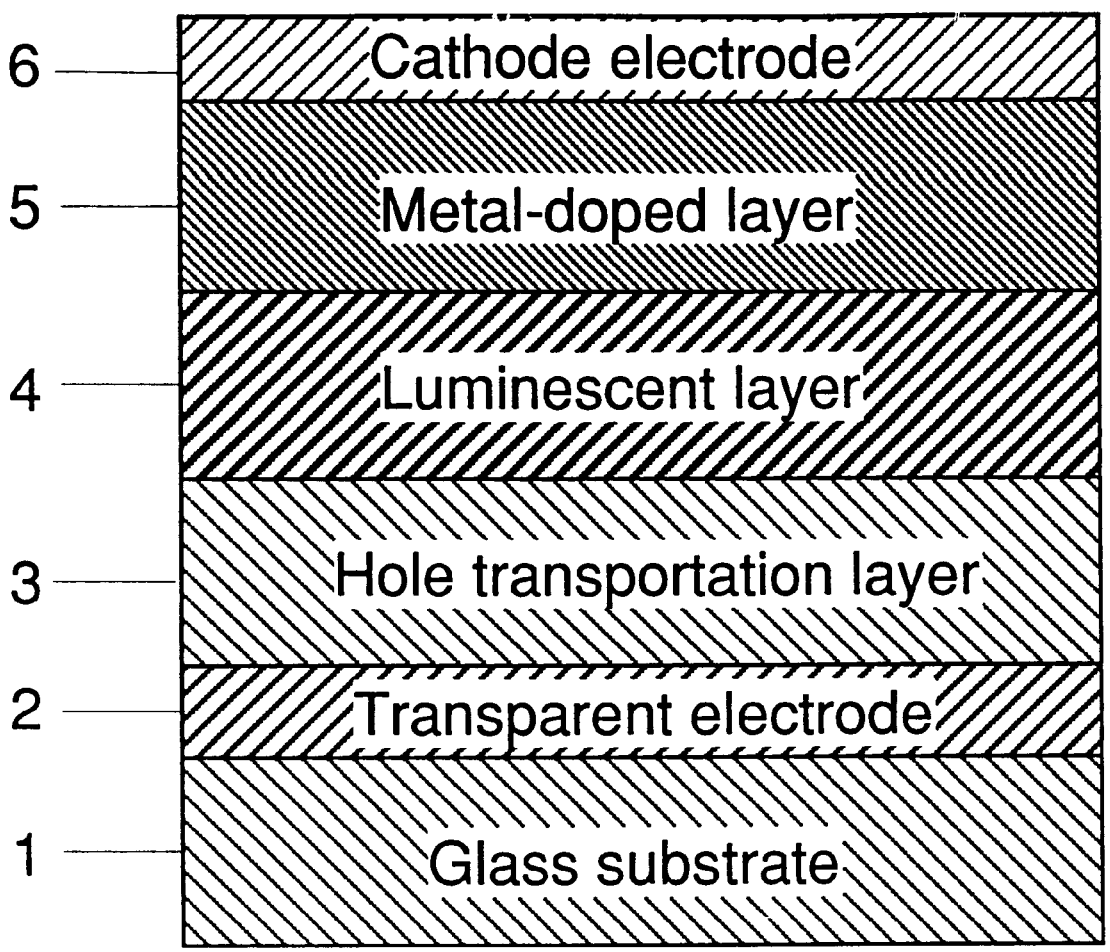
FIG. 1 is a cross-sectional view illustrating a lamination structure of the organic EL device according one preferred embodiment of the present invention.

FIG. 1 is a simplified cross-sectional view illustrating the organic EL device according one preferred embodiment of the present invention. A glass substrate (transparent substrate) 1 has, laminated in the described order on a surface thereof, a transparent electrode 2 constituting an anode electrode, a hole transport layer 3 having a hole-transporting property, a luminescent layer 4, a metal-doped organic compound layer 5 and a back electrode 6 constituting a cathode electrode. Among these components of the device, i.e., layers, the glass substrate (transparent substrate) 1, the transparent electrode 2, the hole transport layer 3, the luminescent layer 4 and the back electrode 6 each may be the well-known component, and the metal-doped layer 5 is the specific component or layer suggested by the present invention.

In addition to the illustrated lamination structure of the layers, the organic EL device of the present invention may include other lamination structures such as anode/luminescent layer/metal-doped layer/cathode, anode/hole transport layer/luminescent layer/metal-doped layer/cathode, anode/hole transport layer/luminescent layer/electron transport layer/metal-doped layer/cathode, anode/hole injection layer/hole transport layer/luminescent layer/metal-doped layer/cathode, anode/hole injection layer/hole transport layer/luminescent layer/electron transport layer/metal-doped layer/cathode, and others. Note that the organic EL device of the present invention may have any lamination structure, as long as it contains a metal-doped layer 5 in an interfacial surface with the cathode electrode 6.

In organic EL devices, an electron injection process from a cathode to an organic compound layer which is basically made of an electrically insulating material is proceeded based on a reduction of the organic compound on a surface of the cathode, i.e., generation of a radical anion state (cf. Phys. Rev. Lett., 14, 229 (1965)). For the EL device of the present invention, a metal, that is, a donor (electron-donating) dopant substance capable of acting as a reducing agent for the organic compound, is previously doped in a layer of the organic compound contacting with the cathode, and thus an energy barrier generated during the electron injection from the cathode can be lowered. Accordingly, the metal-doped layer 5 contained in the EL device of the present invention is a layer of the organic compound having doped therein such metal capable of functioning as the donor dopant. Since the metal-doped layer contains molecules which have been already reduced with the dopant (that is, those in which electrons have been accepted and contained), an energy barrier to the electron injection is small, and thus a driving voltage can be lowered in comparison with the conventional EL devices. In addition, the cathode can be formed from a metal such as an aluminum (Al) which is conventionally used as a wiring material and is stable.

In this instance, the donor dopant is not restricted to a specific one, as long as it is a metal which can reduce the organic compound, that is, alkali metals such as Li, alkali earth metals such as Mg and transition metals including rare earth metals. In particular, the metal having a work function of less than or equal to 4.2 eV can be suitably used as the dopant, and typical examples of such dopant metal include Li, Na, K, Be, Mg, Ca, Sr, Ba, Y, La, Sm, Gd, Yb.

A concentration of the dopant in the metal-doped organic compound layer is not restricted to a specific one, however, it is preferred that the concentration is in the range of 0.1 to 99% by weight. The concentration less than 0.1% by weight results in only a small effect of doping, because the concentration of the molecules of the organic compound reduced by the dopant (hereinafter, referred to as "reduced molecules") is excessively lowered. The concentration above 99% by weight also results in a lowering of the doping effect, because a concentration of the metal in the layer can be remarkably increased beyond the concentration of the molecules of the organic compound, and thus a concentration of the reduced molecules is also excessively lowered.

Further, a thickness of the metal-doped organic compound layer is not restricted to the specific one, however, it is preferred that the thickness is in the range of about 10 to 3,000 Å. The thickness less than about 10 Å is not preferred, because it results in only a small effect of doping, since only a less amount of the reduced molecules are distributed around an interfacial surface of the electrode. Similarly, the thickness above 3,000 Å is not preferred, because it causes an excessive increase of the total thickness of the organic compound layer, and thus induces an increase of the driving voltage.

In the formation of the above-described metal-doped organic compound layer 5, any methods for forming thin films may be used, and typical examples of suitable methods include a vapour deposition method and a sputtering method. In addition, if it is possible to carry out the film formation through coating from a solution, a coating method from a solution such as the spin coating method and the dip coating method may be used in the formation of thin films. In the formation of such thin films, an organic compound to be doped and a dopant may be used after they were dispersed in an inactive polymer.

The organic compounds which can be used in the formation of the luminescent layer, the electron transport layer and the metal-doped layer in the EL device of the present invention each are not restricted to the specific one. Examples of suitable organic compounds include polycyclic compounds such as p-terphenyl, quaterphenyl as well as derivatives thereof, condensed polycyclic hydrocarbon compounds such as naphthalene, tetracene, pyrene, coronene, chrysene, anthracene, diphenylanthracene, naphthacene, phenanthrene as well as derivatives thereof, condensed heterocyclic compounds such as phenanthroline, bathophenanthroline, phenanthridine, acridine, quinoline, quinoxaline, phenazine and the like as well as derivatives thereof, and fluoroceine, perylene, phthaloperylene, naphthaloperylene, perynone, phthaloperynone, naphthaloperylene, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene as well as derivatives thereof.

In addition to the above-mentioned organic compounds, metal-chelated complex compounds described in Japanese Unexamined Patent Publication (Kokai; hereinafter, referred to as JP-A-) Nos. 63-295695, 8-22557, 8-81472, 5-9470 and 5-17764 can be suitably used. Among these metal-chelated complex compounds, suitable metal-chelated oxanoide compounds are metal complexes which contain, as a ligand thereof, at least one selected from 8-quinolinolato and derivatives thereof such as tris(8-quinolinolato)aluminum, bis(8-quinolinolato)magnesium, bis[benzo(f)-8-quinolinolato] zinc, bis(2-methyl-8-quinolinolato) aluminum, tri(8-quinolino lato)indium, tris(5-methyl-8-quinolinolato)aluminum, 8-quinolinolatolithium, tris(5-chloro-8-quinolinolato)gallium, bis(5-chloro-8-quinolinolato)calcium.

Also, oxadiazoles disclosed in JP-A-5-202011, 7-179394, 7-278124 and 7-228579, triazines disclosed in JP-A-7-157473, stilbene derivatives and distyrylarylene derivatives disclosed in JP-A-6-203963, styryl derivatives disclosed in JP-A-6-132080 and 6-88072, and diolefin derivatives disclosed in JP-A-6-100857 and 6-207170 are preferably used in the formation of the luminescent layer, the electron transport layer and the metal-doped organic compound layer.

Further, a fluorescent whitening agent of benzoxazoles, benzothiazoles, benzoimidazoles and the like may be used as the above-described organic compound, and it includes, for example, those described in JP-A-59-194393. Typical examples of the fluorescent whitening agent include the fluorescent whitening agents under the group of benzoxazoles such as 2,5-bis(5,7-di-t-pentyl-2-benzoxazolyl)-1,3,4-thiazole, 4,4'-bis(5,7-t-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)thiophene, 2,5-bis[5-(α, α-dimethylbenzyl)-2-benzoxazolyl]thiophene, 2,5-bis[5,7-di(2-methyl-2butyl)-2-benzoxazolyl]-3,4-diphenylthiophene, 2,5-bis(5-methyl-2-benzoxazolyl) thiophene, 4,4'-bis(2-benzoxazol yl)biphenyl, 5-methyl-2-{2-[4-(5-methyl-2-benzoxazol yl)phenyl] vinyl}benzoxazole, 2-[2-(4-chlorophenyl)vinyl]naphtho(1,2-d)oxazole and the like, under the group of benzothiazoles such as 2,2'-(p-phenylenedipynylene)-bisbenzo thiazole, and under the group of benzoimidazoles such as 2-{2-[4-(2-benzoimidazolyl)phenyl]vinyl}benzoimidazole, 2-[2-(4-carboxyphenyl)vinyl]benzoimidazole.

As a distyrylbenzene compound, the compounds disclosed in, for example, European Patent No. 373,582 may be used. Typical examples of a distyrylbenzene compound include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, 1,4-bis(2-methylstyryl)-2-ethylbenzene.

Furthermore, distyrylpyrazine derivatives disclosed in JP-A-2-252793 may also be used in the formation of the luminescent layer, the electron transport layer and the metal-doped organic compound layer. Typical examples of the distyrylpyrazine derivatives include 2,5-bis(4-methylstyryl) pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, 2,5-bis[2-(1-pyrenyl) vinyl]pyrazine.

In addition, dimethylidine derivatives disclosed in European Patent No. 388,768 and JP-A-3-231970 may also be used as the material for the luminescent layer, the electron transport layer and the metal-doped organic compound layer. Typical examples of the dimethylidine derivatives include 1,4-phenylene-dimethylidine, 4,4'-phenylenedimethylidine, 2,5-xylylene-dimethylidine, 2,6-naphthylenedimethylidine, 1,4-biphenylene-dimethylidine, 1,4-p-terephenylenedimethylidine, 9,10-anthracenediyldimethylidine, 4,4'-(2,2-di-t-butylphenylvinyl)biphenyl, 4,4'-(2,2-diphenylvinyl) biphenyl as well as derivatives thereof, silanamine derivatives disclosed in JP-A-6-49079 and 6-293778, polyfunctional styryl compounds disclosed in JP-A-6-279322 and 6-279323, oxadiazole derivatives disclosed in JP-A-6-107648 and 6-92947, anthracene compounds disclosed in JP-A-6-206865, oxynate derivatives disclosed in JP-A-6-145146, tetraphenylbutadiene compounds disclosed in JP-A-4-96990, and organic trifunctional compounds disclosed in JP-A-3-296595, as well as coumarin derivatives disclosed in JP-A-2-191694, perylene derivatives disclosed in JP-A-2-196885, naphthalene derivatives disclosed in JP-A-2-255789, phthaloperynone derivatives disclosed in JP-A-2-289676 and 2-88689, and styrylamine derivatives disclosed in JP-A-2-250292.

Moreover, in the production of the organic EL device according to the present invention, any of the well-known compounds conventionally used in the production of the prior art organic EL devices may be suitably used.

The arylamine compounds used in the formation of the hole injection layer, the hole transport layer and the hole-transporting luminescent layer are not restricted to the specific compounds, however, it is preferable to use the arylamine compounds disclosed in JP-A-6-25659, 6-203963, 6-215874, 7-145116, 7-224012, 7-157473, 8-48656, 7-126226, 7-188130, 8-40995, 8-40996, 8-40997, 7-126225, 7-101911 and 7-97355. Typical examples of suitable arylamine compounds include, for example, N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostilbenzene, N-phenylcarbazole, 1,1-bis(4-di-p-triaminophenyl) cyclohexane, 1,1-bis(4-di-p-triaminophenyl)-4-phenylcyclohexane, bis(4-dimethylamino-2-methylphenyl) phenylmethane, N,N,N-tri(p-tolyl)amine, 4-(di-p-tolylamino)-4'-[4-(di-p-tolylamino)styryl]stilbene, N,N,N', N'-tetraphenyl-4,4'-diaminobiphenyl N-phenylcarbazole, 4,4'-bis[N-(1-naphthyl)-N-phenylamino]biphenyl, 4,4"-bis [N-(1-naphthyl)-N-phenylamino] p-terphenyl, 4,4'-bis[N-(2-naphthyl)-N-phenylamino]biphenyl, 4,4'-bis[N-(3-acenaphthenyl)-N-phenylamino]naphthalene, 4,4'-bis[N-(9-anthryl)-N-phenylamino]biphenyl, 4,4"-bis[N-(1-anthryl)-N-phenylamino] p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino) naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4'-bis{N-phenyl-N-[4-(1-naphthyl)phenyl]amino}biphenyl, 4,4'-bis [N-phenyl-N-(2-pyrenyl)amino]biphenyl, 2,6-bis[N,N-di(2-naphthyl)amino]fluorene, 4,4"-bis(N,N-di-p-tolylamino) terphenyl, bis(N-1-naphthyl) (N-2-naphthyl)amine. In addition to these arylamine compounds, any of the well-known compounds conventionally used in the production of the prior art organic EL devices may be suitably used.

Further, in the formation of the hole injection layer, the hole transport layer and the hole-transporting luminescent layer, a dispersion of the above-described organic compounds in a polymer or a polymerized product of such organic compounds may be used. Moreover, so-called "π-conjugate polymers" such as polyparaphenylene vinylene and its derivatives, hole-transporting non-conjugate polymers, one typical example of which is poly (N-vinylcarbazole), and σ-conjugate polymers of polysilanes may be used for the same purpose.

The material of the hole injection layer to be deposited over the ITO (indium-tin oxide) electrode is not restricted to a specific one, however, metal phthalocyanines such as copper phthalocyanine as well as non-metal phthalocyanines, carbon films, electrically conducting polymers such as polyanilines may be suitably used in the formation of the hole injection layer. Alternatively, the hole injection layer may be formed by reacting the above-described arylamine compounds with a Lewis acid as an oxidizing agent, thereby generating radical cations.

The material of the cathode electrode is not restricted, as long as it is a metal which can be stably used in air. In particular, suitable cathode material is an aluminum (Al) which is the conventional and well-known wiring electrode.

EXAMPLES

The present invention will be further described with reference to the following examples, however, it should be noted that the present invention is not restricted by these examples.

In the following examples, vapour deposition of the organic compound and that of the metal each was carried out by using the vapour deposition apparatus "VPC-400" commercially available from Shinkuu Kikou Co., and spin-coating was made in the spin-coater "IH-D3" commercially available from Mikasa Co. The thickness of the layer formed by spin-coating was determined by using the profilometer "DekTak3ST" commercially available from Sloan Co.

Further, the characteristics of the organic EL device was determined by using the DC electric source PBX 40-2.5 commercially available from Kikusui Co., the multimeter VOAC-7510 commercially available from Iwatsu Co., and the luminance meter BM-8 commercially available from Topcon Co. A DC voltage was stepwise applied at an increasing rate of one volt per 2 seconds to the organic EL device having an ITO anode and an aluminum (Al) cathode, and the luminance and the electric current were determined after one second had passed from the completion of each increase of the voltage. The EL spectrum was determined by using the optical multichannel analyzer PMA-10, commercially available from Hamamatsu Photonics Co., driven at a constant electric current.

Example 1

The organic EL device having the lamination structure illustrated in FIG. 1 was produced according to the present invention.

A glass substrate 1 coated with an ITO (indium-tin oxide) layer having a sheet resistance of about 15 Ω/□ as a transparent anode electrode 2, commercially available as an electron beam deposition product from Asahi Glass Co., was provided. α-NPD having a hole transport property was deposited onto the ITO-coated glass substrate 1. α-NPD is represented by the following formula (1):

Formula(1)

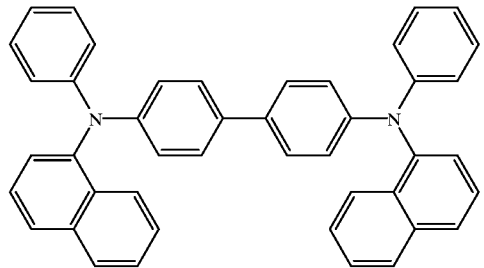

under the vacuum deposition conditions of about $10^{-6}$ torr and about 3 Å/sec to form a hole transport layer 3 having a thickness of about 400 Å.

Next, an aluminum complex of tris(8-quinolinolato) (hereinafter, briefly referred to as "Alq") exhibiting a green luminescence was deposited onto the obtained hole transport layer 3. An aluminum complex of tris(8-quinolinolato) is represented by the following formula (2):

Formula(2)

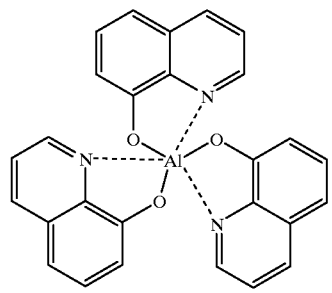

under the same vacuum deposition conditions as in the above-described deposition of the hole transport layer 3 to form a luminescent layer 4 having a thickness of about 300 Å.

After the formation of the luminescent layer 4, Alq and lithium (Li) was co-deposited onto the layer 4 under the controlled vacuum deposition conditions of each of Alq and Li so that a concentration of Li may be about 1.5% by weight, to form a metal(Li)-doped Alq layer 5 having a thickness of about 400 Å.

Finally, aluminum (Al) was deposited onto the metal-doped layer 5 at a deposition speed of about 15 Å/sec to form a back electrode 6 acting as a cathode and having a thickness of about 1,000 Å. The organic EL device having a square luminescent area of about 0.5 cm (length) by about 0.5 cm (width) was thus obtained.

Figure 2:
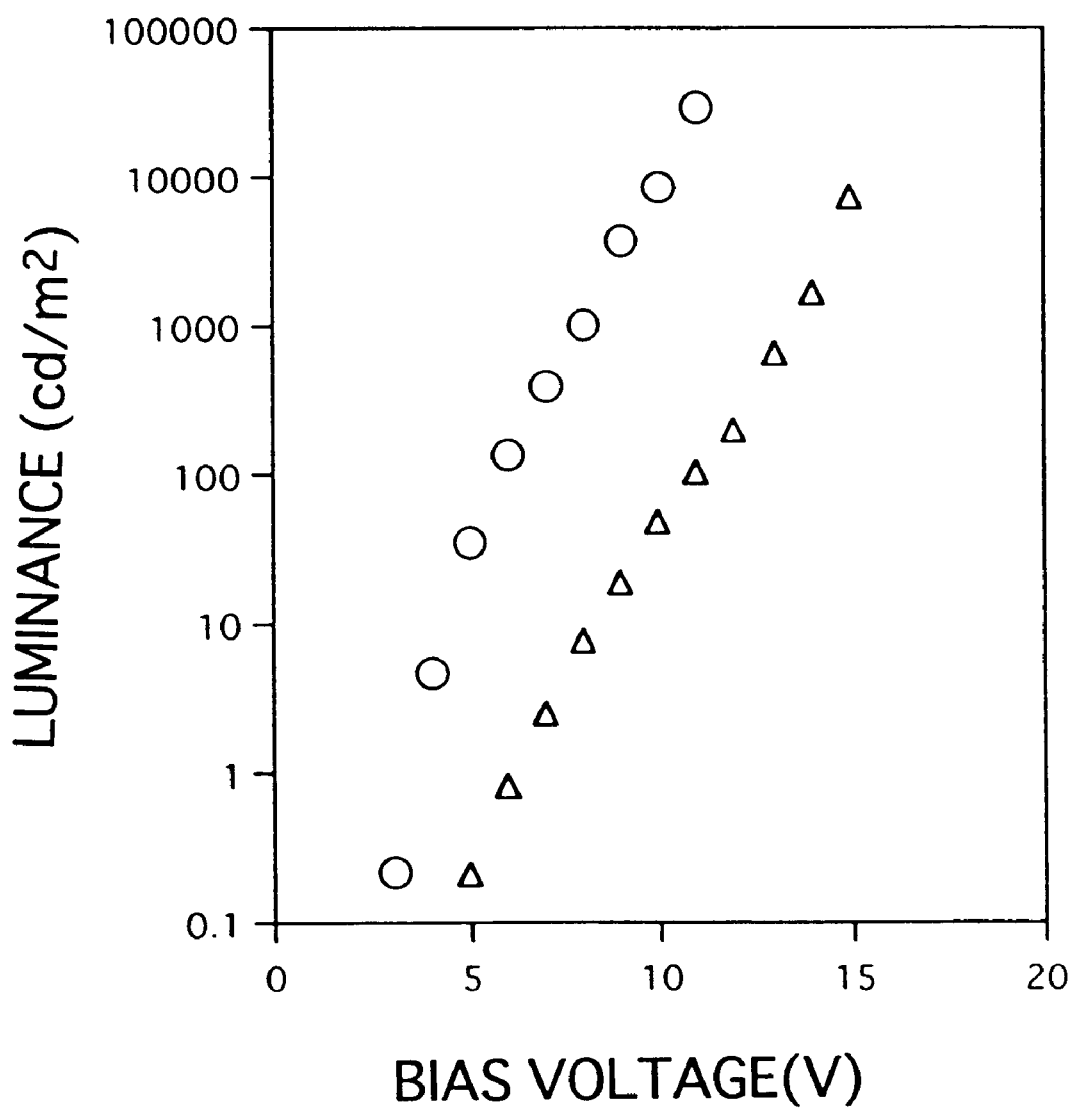
FIG. 2 is a graph showing the relationship between the bias voltage and the luminance for the organic EL device according the present invention and the comparative organic EL device.
Figure 3:
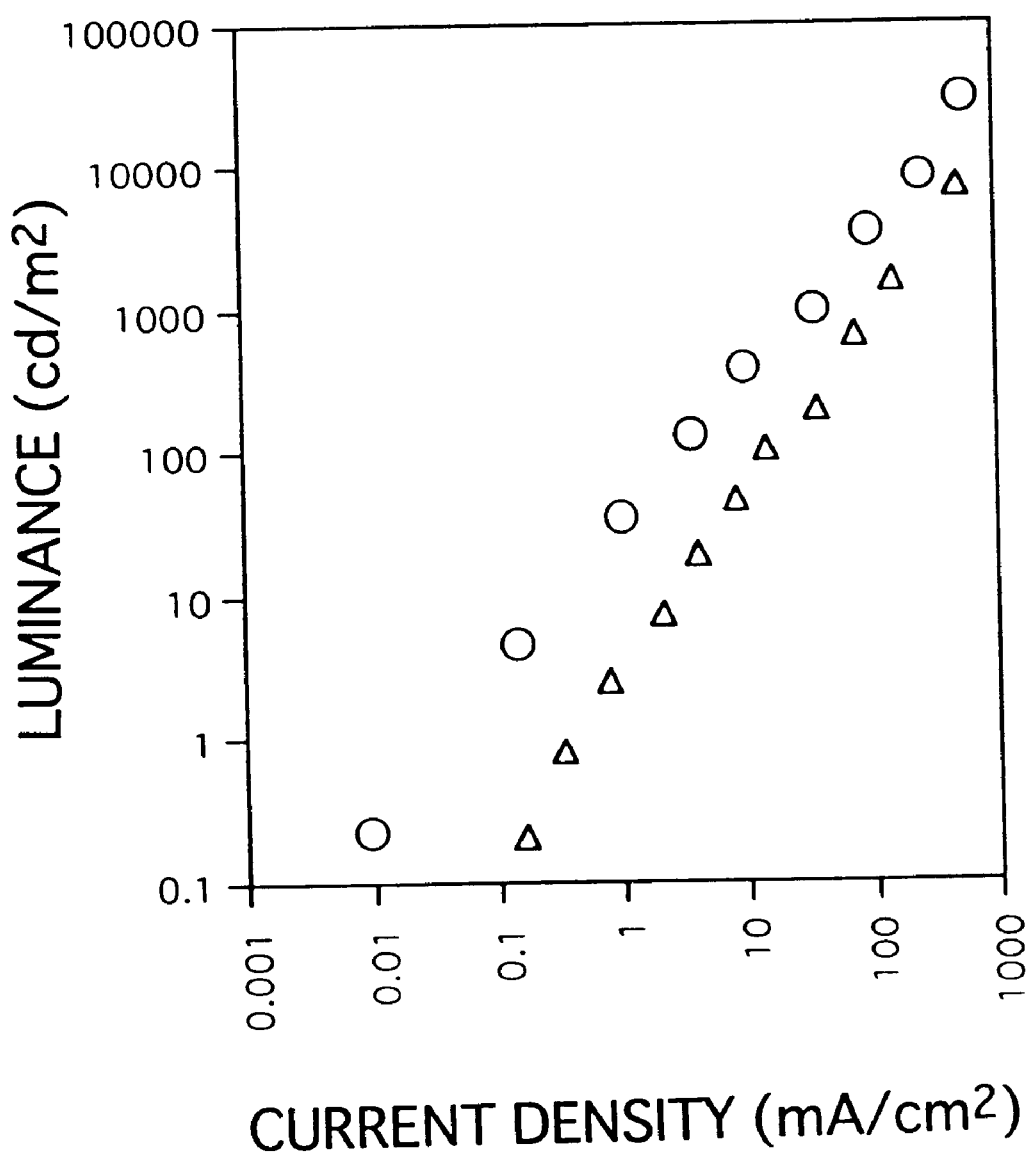
FIG. 3 is a graph showing the relationship between the current density and the luminance for the organic EL device according the present invention and the comparative organic EL device.

In the organic EL device, a DC voltage was applied to between the ITO anode 2 and the Al cathode 6, and a luminance of the green luminescence from the luminescent Alq layer 4 was determined. The results were plotted with circles in each of FIG. 2 showing the relationship between the bias voltage and the luminance of the EL device and FIG. 3 showing the relationship between the current density and the luminance of the EL device. These results indicate that a maximum luminance of 39,000 cd/m² could be obtained at the applied bias voltage of about 12 volts and the current density of about 800 mA/cm², and a luminance of about 1,000 cd/m² could be obtained at the applied bias voltage of about 8 volts.

Comparative Example 1

The procedure of Example 1 was repeated with the proviso that, for the purpose of comparison, a metal-doped layer 5 was omitted from the organic EL device. That is, α-NPD was first deposited onto the ITO-coated glass substrate 1 to form a hole transport layer 3 having a thickness of about 400 Å, and then Alq was deposited under the same vacuum deposition conditions as in the deposition of the hole transport layer 3 to form a luminescent Alq layer 4 having a thickness of about 600 Å. Then, aluminum (Al) was deposited at a thickness of about 2,000 Å over the luminescent Alq layer 4 to form a cathode 6. The organic EL device was thus obtained.

In the organic EL device, the luminance of the green luminescence from the luminescent Alq layer 4 was determined as in Example 1. The results were plotted with triangular marks in each of FIG. 2 and FIG. 3. These results indicate that only a luminance of at most about 6,700 cd/m² could be obtained at the applied bias voltage of about 15 volts, and an application of the voltage of about 13 volts was required to obtain a luminance of about 1,000 cd/m². It can be appreciated from these results that the presence of the metal-doped layer 5 which is essential to the organic EL device of the present invention is effective in reducing the driving voltage of the EL device.

Comparative Example 2

The procedure of Example 1 was repeated with the proviso that, for the purpose of comparison, a metal-doped layer 5 was included in the organic EL device in the position which does not satisfy the requirement for the lamination structure of the present invention. That is, α-NPD was first deposited onto the ITO-coated glass substrate 1 to form a hole transport layer 3 having a thickness of about 400 Å, followed by, in sequence, vacuum co-deposition of Alq and Li at a Li concentration of about 1.5% by weight to form a metal-doped layer 5 having a thickness of about 300 Å, and sole deposition of Alq to form a luminescent layer 4 having a thickness of about 300 Å. Then, aluminum (Al) was deposited at a thickness of about 1,000 Å over the luminescent Alq layer 4 to form a cathode 6. The organic EL device was thus obtained.

In the organic EL device, only a maximum luminance of 8 cd/m² could be obtained at the applied bias voltage of 25 volts. It is appreciated from this result that the presence of the Li-doped Alq layer in the neighborhood of the cathode is essentially required to obtain a highly increased luminance in the EL device.

Also, it was observed that the luminescent spectrum of the EL device was broadened in comparison with the spectrum of Alq per se, and thus a fluorescence property of the device was lowered. This fact evidences that Alq was reduced upon doping of Li therein, and thus an energy level of Alq was varied. Also, the same could be observed from the variation of the ultraviolet (UV) absorption and visible light absorption spectrums in the Li-doped Alq layer.

Comparative Example 3

The procedure of Example 1 was repeated with the proviso that, for the purpose of comparison, a metal-doped layer 5 was omitted from the organic EL device and an alloy of Mg and Ag was used in place of Al as the cathode material. That is, α-NPD was first deposited onto the ITO-coated glass substrate 1 to form a hole transport layer 3 having a thickness of about 400 Å, and then Alq was deposited under the same vacuum deposition conditions as in the deposition of the hole transport layer 3 to form a luminescent Alq layer 4 having a thickness of about 600 Å. Then, an alloy of Mg and Ag in a weight ratio of about 10:1 was deposited at a thickness of about 1,500 Å over the luminescent Alq layer 4 to form a cathode 6. The organic EL device was thus obtained.

In the organic EL device, a maximum luminance of 17,000 cd/m² could be obtained at the applied bias voltage of about 13 volts, and an application of the voltage of about 9.5 volts was required to obtain a luminance of 1,000 cd/m². It is appreciated from these results and the above-described results of Example 1 in which the EL device contained the metal-doped layer and an application of the voltage of about 8 volts was required to obtain the same luminance of 1,000 cd/m², that the use of the metal-doped layer in the EL device is more effective in a reduction of the driving voltage and an increase of the maximum luminance, than the use of the alloy-made cathode in the EL device.

Example 2

The procedure of Example 1 was repeated with the proviso that bathophenanthroline was used in place of Alq in the formation of the metal-doped layer 5. That is, α-NPD was first deposited onto the ITO-coated glass substrate 1 to form a hole transport layer 3 having a thickness of about 400 Å, followed by vacuum deposition of Alq to form a luminescent layer 4 having a thickness of about 300 Å. Thereafter, bathophenanthroline was codeposited onto the luminescent Alq layer 4. Bathophenanthroline is represented by the following formula (3):

Formula(3)

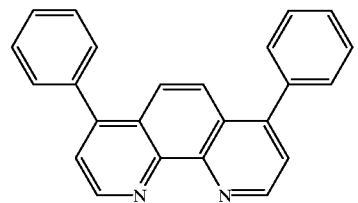

and Li under the controlled vacuum deposition conditions of each of bathophenanthroline and Li so that a concentration of Li may be about 2% by weight, to form a metal-doped layer 5 having a thickness of about 300 Å. Then, aluminum (Al) was deposited at a thickness of about 1,000 Å over the metal-doped layer 5 to form a cathode 6. The organic EL device was thus obtained.

In the organic EL device, a maximum luminance of 28,000 cd/m² could be obtained at the applied bias voltage of about 12 volts, along with the current density of about 820 mA/cm². That is, in this example, a highly increased luminance which is comparable to that of the above-described Example 1 could be obtained.

Comparative Example 4

The procedure of Example 2 was repeated with the proviso that, for the purpose of comparison, only bathophenanthroline was deposited in place of the co-deposition of bathophenanthroline and Li to form a metal-undoped layer. That is, α-NPD was first deposited onto the ITO-coated glass substrate 1 to form a hole transport layer 3 having a thickness of about 400 Å, and then Alq was deposited under the same vacuum deposition conditions as in the deposition of the hole transport layer 3 to form a luminescent Alq layer 4 having a thickness of about 300 Å. Thereafter, bathophenanthroline was sole deposited onto the luminescent Alq layer 4 to form a metal-undoped layer having a thickness of about 300 Å. Then, aluminum (Al) was deposited at a thickness of about 1,000 Å over the metal-undoped layer to form a cathode 6. The organic EL device was thus obtained.

In the organic EL device, only a maximum luminance of 9,500 cd/m$^2$ could be obtained at the applied bias voltage of about 15 volts, along with the current density of only about 270 mA/cm$^2$. That is, this comparative example evidences that the doping of Li in the bathophenanthroline in the above-described Example 2 is effective to reduce a driving voltage of the EL device.

Example 3

The procedure of Example 1 was repeated with the proviso that magnesium (Mg) was used in place of Li in the formation of the metal-doped layer 5. That is, α-NPD was first deposited onto the ITO-coated glass substrate 1 to form a hole transport layer 3 having a thickness of about 400 Å, followed by vacuum deposition of Alq to form a luminescent Alq layer 4 having a thickness of about 600 Å. Thereafter, Alq and Mg was codeposited onto the luminescent Alq layer 4 under the controlled vacuum deposition conditions of each of Alq and Mg so that a concentration of Mg may be about 93% by weight, to form a metal-doped layer 5 having a thickness of about 20 Å. Then, aluminum (Al) was deposited at a thickness of about 1,000 Å over the metal-doped layer 5 to form a cathode 6. The organic EL device was thus obtained.

In the organic EL device, a maximum luminance of 28,000 cd/m$^2$ and a current density of about 920 mA/cm$^2$ could be obtained. That is, in this example, a highly increased luminance which is comparable to that of the above-described Example 1 could be obtained.

Example 4

The procedure of Example 1 was repeated with the proviso that polyparaphenylene vinylene (PPV) was first deposited onto the ITO-coated glass substrate 1 in accordance with the method described in Burroughes et al., Nature, 347, 539 (1990) to form a luminescent PPV layer 4 having a thickness of about 1,000 Å. Then, polystyrene of a molecular weight of 200,000 and diphenylanthracene in a weight ratio of 2:1 were dissolved in tetrahydrofuran, and 2% by weight of Li based on diphenylanthracene was dispersed, with stirring, in the resulting solution to cause a reaction of Li with diphenylanthracene. Using the thus obtained tetrahydrofuran solution, the luminescent PPV layer 4 was spin-coated with diphenylanthracene/Li-containing polystyrene in a nitrogen atmosphere to form a metal-doped layer 5 having a thickness of about 50 Å. Then, aluminum (Al) was deposited at a thickness of about 1,000 Å over the metal-doped layer 5 to form a cathode 6. The organic EL device was thus obtained.

In the organic EL device, a yellowish green luminescence due to presence of the luminescent PPV layer was observed, along with a maximum luminance of 4,200 cd/m$^2$.

Comparative Example 5

The procedure of Example 4 was repeated with the proviso that, for a comparison purpose, a metal-doped layer 5 was omitted from the organic EL device. That is, PPV was deposited onto the ITO-coated glass substrate 1 in accordance with the manner described in Example 4 to form a luminescent PPV layer 4 having a thickness of about 1,000 Å. Then, aluminum (Al) was deposited at a thickness of about 1,000 Å over the luminescent PPV layer 4 to form a cathode 6. The organic EL device was thus obtained.

In the organic EL device, a yellowish green luminescence due to presence of the luminescent PPV layer was observed, however, the maximum luminance observed was only about 400 cd/m$^2$. This result evidences that in the above-described Example 4, the presence of the metal-doped layer 5 was effective in reducing the driving voltage of the EL device.

As can be appreciated from the above descriptions, the organic EL device of the present invention enables production of luminescent devices or devices showing a high efficiency and high luminance capable of being driven at a low driving voltage, because it contains a metal-doped organic compound layer which comprises an organic compound having doped therein a metal acting as a donor (electron-donating) dopant, in an interfacial surface with a cathode electrode. Accordingly, the organic EL device of the present invention can exhibit a high utility in practical use, and enables an effective utilization of the same as display devices, light sources and others.

What is claimed is:

1. An organic electroluminescent device comprising:

an anode electrode;

a cathode electrode opposed to said electrode;

at least one luminescent layer constituted from an organic compound positioned between said anode electrode and cathode electrode; and a layer of an organic compound doped with a metal capable of acting as a donor dopant, said layer of an organic compound being positioned in an interfacial surface with said cathode electrode.

2. The organic electroluminescent device according to claim 1, in which said donor dopant consists of at least one metal selected from alkali metals, alkali earth metals and transition metals including rare earth metals, said metal having a work function of less than or equal to 4.2 eV.

3. The organic electroluminescent device according to claim 1, in which said donor dopant is contained in an amount 0.1 to 99% by weight in said metal-doped organic compound layer.

4. The organic electroluminescent device according to claim 1, in which said metal-doped organic compound layer has a thickness of 10 to 3,000 Å.

5. The organic electroluminescent device according to claim 1, in which at least one of the materials constituting said cathode electrode is aluminum.

6. An organic electroluminescent device comprising at least one luminescent layer constituted from an organic compound, positioned between an anode electrode and a cathode electrode opposed to each other, in which a layer of an organic compound doped with a metal capable of acting as a donor dopant is contained in an interfacial surface with said cathode electrode.

* * * * *